United States Patent [19]

Smith-Vaniz

[11] Patent Number: 4,808,916

[45] Date of Patent: Feb. 28, 1989

[54] POWER SUPPLY MAGNETIC SHUNT FOR TRANSMISSION LINE SENSOR MODULE

[75] Inventor: William R. Smith-Vaniz, Darien, Conn.

[73] Assignee: Niagara Mohawk Power Corporation, Syracuse, N.Y.

[21] Appl. No.: 930,493

[22] Filed: Nov. 14, 1986

[51] Int. Cl.$^4$ .................. G01R 21/12; G01R 1/36
[52] U.S. Cl. ........................... 324/110; 324/127; 340/870.39
[58] Field of Search ............... 324/127, 110; 323/220, 323/221, 223, 231, 232, 237, 239, 247, 265, 273, 274, 282, 284, 305, 306, 310, 311, 355, 358, 362, 902; 340/870.39

[56] References Cited

U.S. PATENT DOCUMENTS

| | | | |
|---|---|---|---|
| 400,515 | 4/1889 | Thomson | 323/305 |
| 1,955,317 | 4/1934 | Wentz | 324/127 X |
| 2,724,821 | 11/1955 | Schweitzer, Jr. | 324/127 |
| 2,763,827 | 9/1956 | Evans | 323/306 X |
| 3,346,811 | 10/1967 | Perry et al. | 324/127 X |
| 3,428,896 | 2/1969 | Schweitzer, Jr. | 324/127 X |
| 3,453,544 | 7/1969 | Schweitzer, Jr. | 324/127 |
| 4,298,838 | 11/1981 | Akamatsu et al. | 324/117 R |
| 4,300,090 | 11/1981 | Weber | 323/311 |

FOREIGN PATENT DOCUMENTS

| | | |
|---|---|---|
| 0181054 | 5/1986 | European Pat. Off. . |
| 2304155 | 3/1976 | France . |
| 1542445 | 3/1979 | United Kingdom . |

*Primary Examiner*—Jerry Smith
*Assistant Examiner*—Stephen M. Baker
*Attorney, Agent, or Firm*—Lalos & Keegan

[57] ABSTRACT

A self contained sensor module mounted on a power transmission line. The module is capable of measuring various parameters such as line current, voltage, conductor temperature and ambient temperature. The parameter values are processed by sensor electronics which digitize and periodically transmit the values to a ground receiver. The module power supply is coupled to the transmission line conductor by a transformer. The line conductor extends through a magnetic core in the module housing. A secondary shunt magnetic core is provided to limit induction of high voltages as a result of excess current flowing through the transmission line conductor.

5 Claims, 8 Drawing Sheets

POWER SUPPLY MAGNETIC SHUNT FOR TRANSMISSION LINE SENSOR MODULE

CROSS-REFERENCE TO RELATED APPLICATIONS

This application is related to copending applications Ser. No. 484,681, filed Apr. 13, 1983, Ser. No. 564,924, filed Dec. 23, 1983, Ser. No. 669,589, filed Nov. 8, 1984, Ser. No. 795,167, filed Nov. 5, 1985 and Ser. No. 872,011, filed June 9, 1986.

BACKGROUND OF THE INVENTION

This invention relates to apparatus for measuring operating parameters of a high voltage power conductor. More particularly, it relates to radio transmitting sensors which are mounted on the transmission lines. The sensors normally derive their power through electromagnetic induction using the magnetic field generated as a result of current flowing through the transmission line conductor. Transmission line sensors of the above type are disclosed in the U.S. patent of Howard R. Stillwell and Roosevelt A. Fernandes entitled Transponder Unit for Measuring Temperature and Current on Live Transmission Lines, No. 4,384,289, issued May 17, 1983, which patent is incorporated herein by reference.

Various power line sensors have been disclosed in the prior art. For example, see U.S. Pat. Nos. 3,428,896, 3,633,191, 4,158,810 and 4,268,818. Sensors of this type and of the improved form disclosed in the above-identified Stillwell and Fernandes patent have been proposed for dynamic line rating of electrical power transmission lines.

The power line sensors available in the prior art measure quantities associated with operation of the overhead line such as voltage on the conductor, current flow in the conductor, conductor temperature and ambient temperature. The information gathered is transmitted to a local ground station. Data from various ground receivers is transmitted to a central control station where the information is analyzed. Based on this analysis, the entire power system is controlled with power being supplied to the various transmission lines in accordance with their measured parameters.

The compact toroidal-shaped sensor modules, disclosed in U.S. Pat. No. 4,384,289, and in the prior copending applications referenced above, contain the sensor electronics, power supply and transmitter circuits, and hardware for attaching the sensors to the transmission lines. Under normal operating conditions, power for the sensor module is derived from the transmission line conductor and converted into regulated supply voltages for the sensor electronics and transmitter.

The module power supply is coupled to the transmission line conductor by a transformer. The line conductor extends through a magnetic core in the module housing and is utilized as a single turn primary winding in the transformer. A secondary winding on the core is connected to power conversion and regulation circuits to supply the required voltages for the module's electronics.

The harsh environment of power transmission lines subjects the sensor module to power supply fluctuations due to a variety of transient line conditions. Under certain conditions, e.g., fault conditions, current flow in the conductor will be far in excess of the current required by the load (i.e., sensor electronics and transmitter).

In the sensor modules described in the copending applications, the voltage supplied to the load is regulated by monitoring the DC output voltage and removing the load from the transformer secondary whenever the DC output voltage is too high. However, when the conductor current is very high, large secondary voltage peaks appear across the unloaded winding as the alternating current in the conductor passes through zero. This may result in damage to power supply circuitry.

The open circuit voltage across the secondary winding can be many hundreds of volts and will depend on the number of turns of the winding. It is desirable to have the sensor module be operable even when current in the conductor is at very low levels. As a result, many turns in the secondary winding are required so that a sufficient DC output voltage can be produced to power the module electronics under low current conditions. Unfortunately, this also results in unmanageable secondary voltages being produced when current is very high. To overcome this problem, rectifier and regulation circuits can be selected to withstand high voltages. These circuits, however, will inhibit operation under low current conditions because of their large forward voltage drop or their requirement for large gate drive power.

In accordance with the present invention, the transmission line sensor module is provided with a shunt regulator that inhibits high voltage induction in the transformer secondary resulting from excess currents flowing in the conductor (transformer primary). The magnetic circuit of the power supply has been altered by providing a secondary core which acts as a magnetic shunt for the primary core.

The primary core in the sensor housing has a relatively large cross sectional area and includes a small air gap which separates two primary core halves. This is necessary to permit the sensor module to be opened and installed around the conductor. The primary core has a relatively high inductance at low levels of current which enables adequate output voltage to be available when minimum current is flowing in the conductor. The secondary core includes a larger air gap and, at low flux densities has high reluctance relative to the main core. The secondary core does not, therefore, impair the voltage output at low currents. The size of the air gap in the secondary core determines at what value of current in the conductor flux is diverted into the secondary core. The secondary core has a larger cross sectional area than the primary core. This inhibits saturation of the secondary core when current values are large and the primary core (excluding the portion linking the winding) becomes saturated.

In the power supply of the present invention, an effective short circuit is placed across the secondary winding when the load voltage exceeds a predetermined value. Current in the winding will be proportional to the reluctance caused by the air gap in the secondary core which acts to limit the rapid saturation of that part of the primary core that links the winding. Current induced in the winding, and associated dissipation, are therefore limited to an acceptable value. However, the total reluctance of the magnetic circuit in a circular path around the winding (including a portion of the primary core and the secondary core) is low enough to permit sufficient induced voltage even with minimum currents.

It is therefore an object of the present invention to provide a transmission line sensor module operable under both the conditions of very high conductor current and relatively low conductor current.

Another object of the invention is to provide a power supply circuit which inhibits excessive output voltages when the transmission line conductor current is high.

A further object of the invention is to provide a power supply circuit which effectively short circuits the power transformer secondary when a predetermined output voltage level is sensed, thereby protecting the load circuitry.

Another object of the invention is to provide a magnetic circuit in a transformer with a shunt magnetic path having a relatively high reluctance to limit induction of secondary voltages and short circuit current in the secondary winding.

Still another object of the invention is to provide a magnetic circuit in a transformer with a relatively high inductance at low flux densities to enable sufficient output voltages to be produced, while having a relatively high reluctance at high flux densities to limit rapid saturation of the magnetic core linking the winding.

DETAILED DESCRIPTION

The transmission line sensors embodying the present invention monitor a variety of conductor parameters. Each sensor is equipped to measure line current, line to neutral voltage, frequency, phase angle, conductor temperature, and ambient temperature. The values of the monitored parameters are fed to a central location which uses the information to control an entire transmission system.

Figure 1:
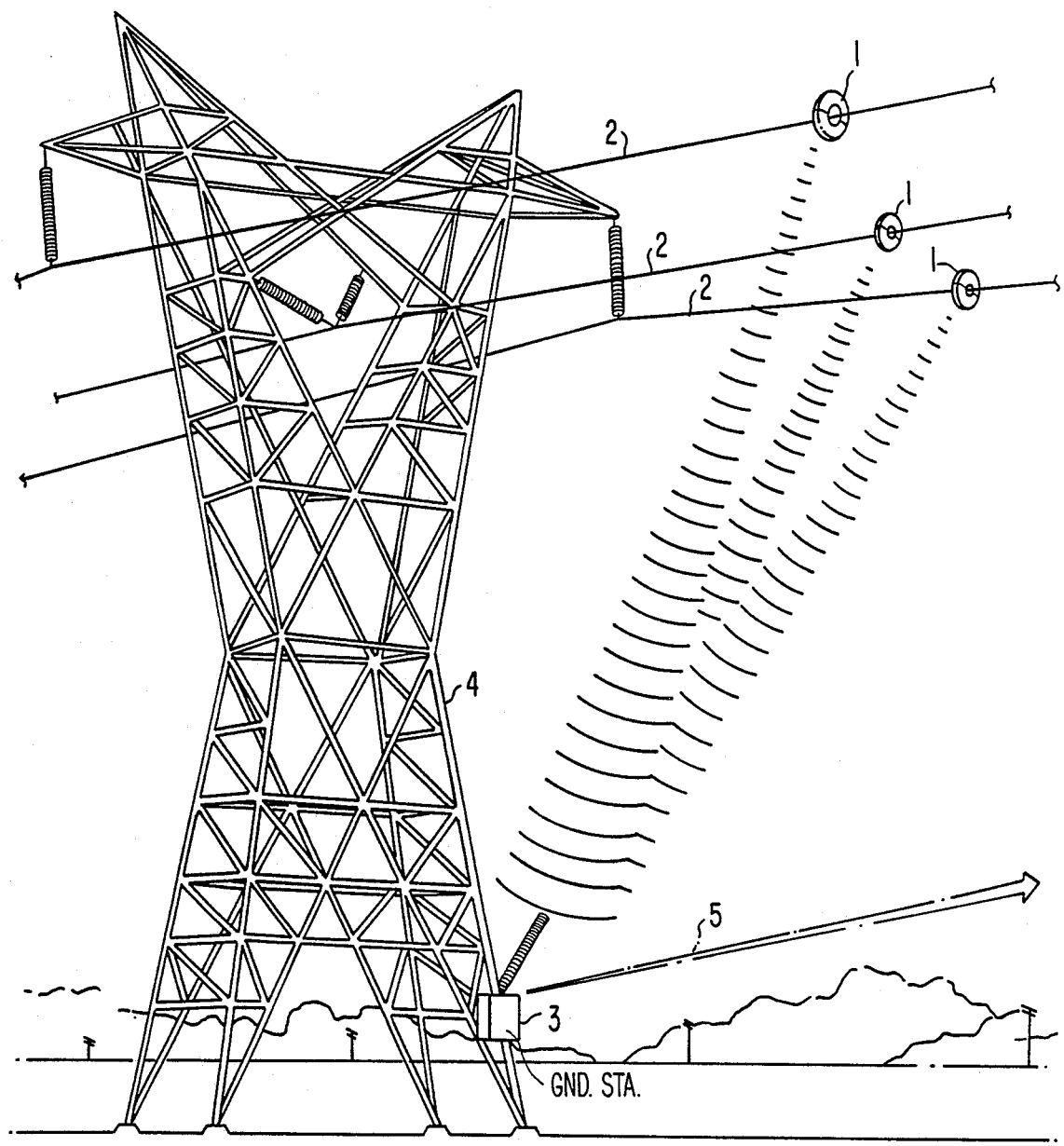
FIG. 1 is a view of several sensor modules attached to the three phase conductors of an electric power line and apparatus for transmitting the measured parameters.

FIG. 1 illustrates several sensors 1 mounted on power conductors 2. Each sensor includes electronics which process and digitize the parameter values and assemble the digital data into appropriate encoded messages. Sensor module electronics include a microprocessor, RAM, I/O, and timer components as disclosed in copending application Ser. No. 484,681. The digital data is transmitted by the sensor modules 1 to a local ground station 3 which may be mounted on an electrical transmission tower 4. The digital data is transmitted, typically once a second, by means of a 950 MHz FM radio link in a 16 millisecond burst.

Ground station 3 includes a microprocessor which further processes the data. For example, data received from the 3 phase set of FIG. 1 can be used to calculate power parameters such as total circuit kilowatts, kilovars, and voltamps. The ground station 3 includes provisions for conversion of data to the form and parameters required by the central station.

Ground station 3 transmits its data to a central monitoring host computer, typically once a second, over data link 5 (e.g., radio, land lines, or satellite channels). The measured data is then processed by the control computer which issues appropriate control signals over other transmission links to switchgear at electrical substations. Thus, the power supply to transmission lines may be varied in accordance with their measured temperature and electrical parameters.

Figure 2:
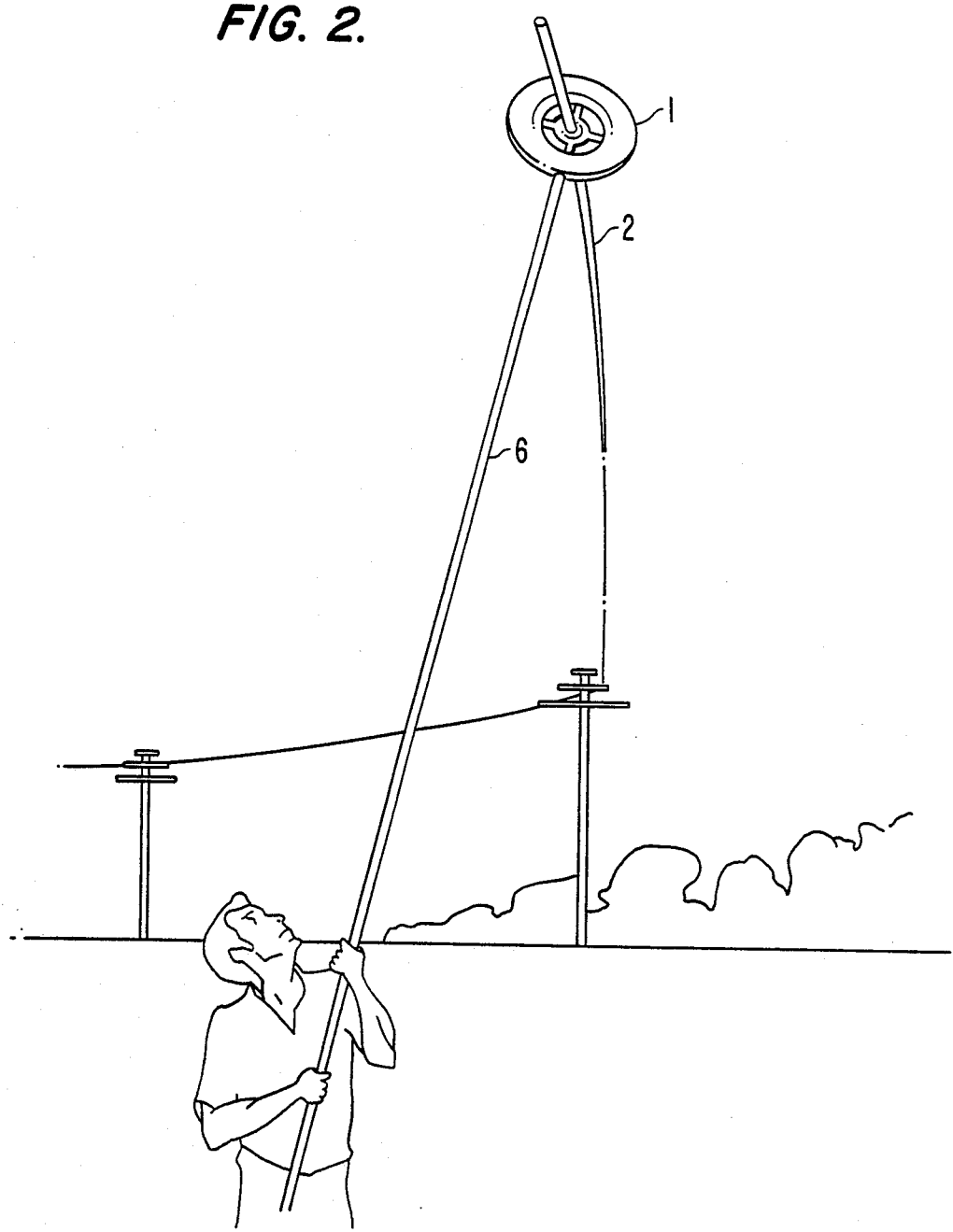
FIG. 2 is a view of a permanent or semi-permanent sensor module embodying the present invention being mounted on a transmission line.

The sensor modules can be placed throughout the power transmission system to monitor line characteristics and ensure effective reliable system control. As illustrated in FIG. 2, the modules 1 can be easily and quickly mounted on a line conductor 2 using a "hot stick" 6.

The size, shape, and operating characteristics of the sensor modules enable its use in a wide variety of conditions and situations. Each module is relatively small and shaped like a donut, with a 12⅝" major diameter and a maximum thickness of 4¾". It weighs approximately 18 pounds. Environmental operating conditions include: ambient air temperature range of −40° C. to +45° C.; driving rain, sleet, snow and ice buildup; falling ice from overhead conductors, sun loading; and vibrations of conductors 2. All electronics within the module are sealed in water-tight compartments, and the module is protected against lightning surges by MOV devices and proper grounding and shielding. All exterior surfaces are rounded and free from sharp edges so as to prevent corona.

Figure 3:
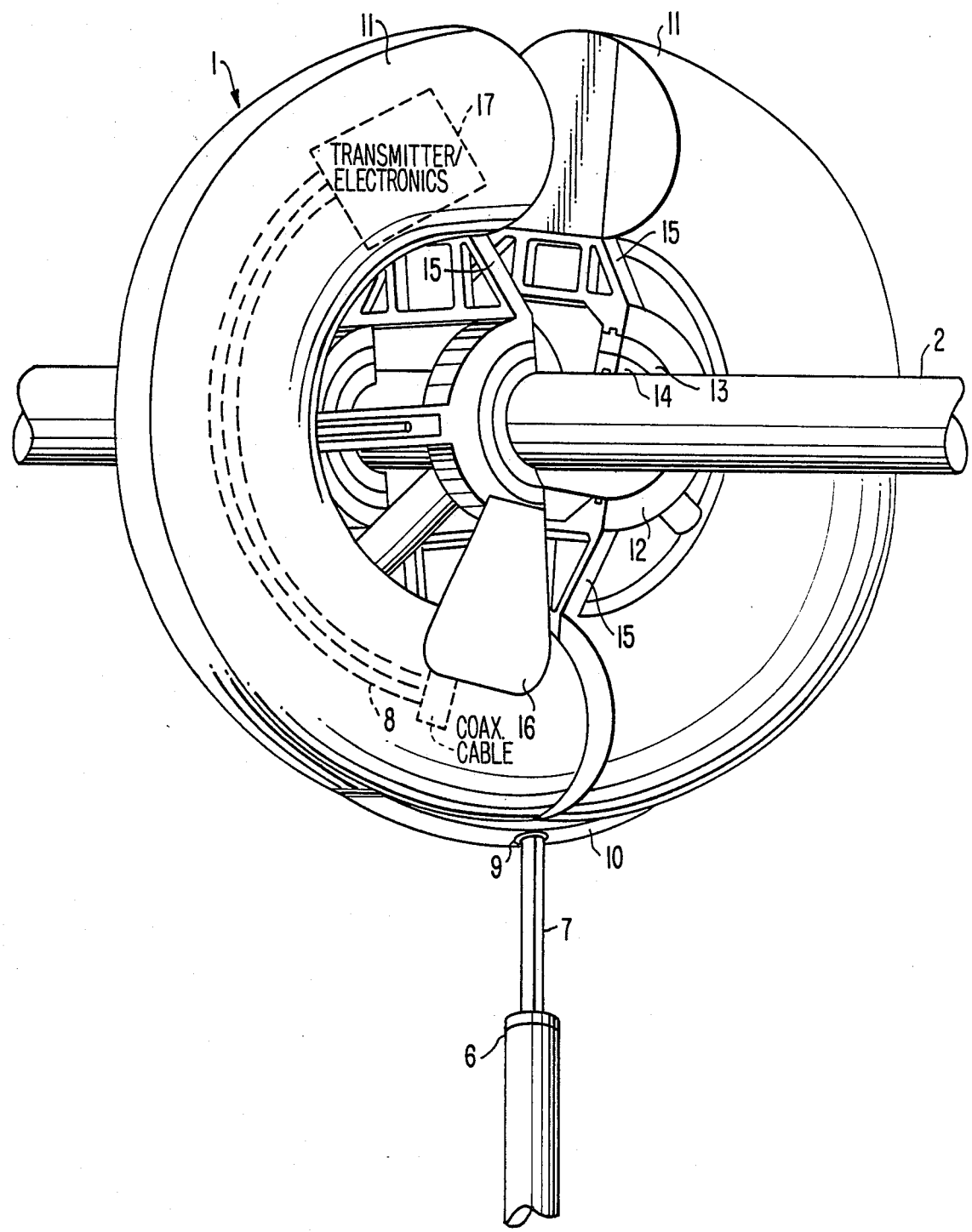
FIG. 3 is a perspective view showing the sensor module being mounted on an energized conductor.
Figure 4:
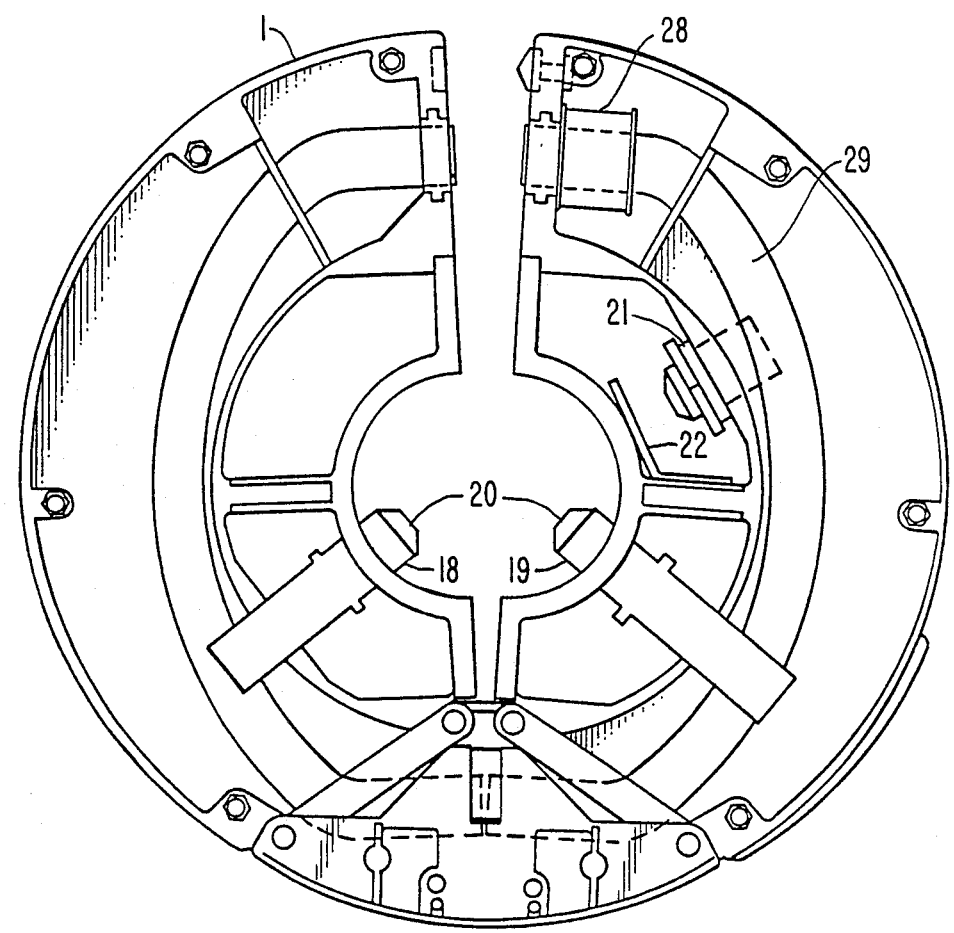
FIG. 4 is a cross section view of a sensor module.

FIGS. 3 and 4 illustrate the configuration of the sensor module's exterior and interior, respectively. As shown in FIG. 3, the module contains two lower sections 10 and two covers or upper sections 11, held together by six bolts (not shown). Each lower section 10 is provided with a top hub 13 and a bottom hub 14, supported by three open radial webs 15. The sensor housing, generally indicated at 1, is secured to a clamping jaws assembly 12 by the open radial webs 15. The diameter of the internal opening of the assembly is variable and is selected for each specific application. The assembly diameter can be chosen to accommodate different power cables from 0.5" to 2" in diameter. An R.F. impedance matching network 16, mounted near assembly 12, is connected via coaxial cable parts 8 to a shielded transmitter and electronics shown generally at 17 inside module 1.

Also shown in FIG. 3 is a hot stick tool with an Allen wrench portion 7 which fits within a hole 9 in module 1 mounted on conductor 2. With the hot stick tool 6 inserted into module 1, the hot stick is turned in one direction to cause the module to split so that it can be placed over a conductor. Turning the hot stick in the opposite direction causes the module to close over the conductor and clamp it tightly. The tool 6 can then be removed by simply pulling it away. Reinsertion and turning will open the module and allow it to be removed from the transmission line. This placement/removal feature provides great flexibility in locating the modules in the power transmission system.

FIG. 4 illustrates the sensor components which measure the temperature parameters of the transmission line. The temperature of the transmission line is measured by conductor temperature probes 18 and 19. These probes are spring loaded against the conductor when the module is installed. The contacting tip 20 is beryllia and inhibits corrosion and yet conducts heat efficiently to the temperature transducer within. It is a non-conductor of electricity so as not to create a low resistance path from the conductor to the electronics. An ambient probe 21 is provided with a shield 22 covering the hub area so that the probe measures the temperature of the air rather than the temperature of the conductor. The hub and spoke area in the center of the module and the temperature probe placement are designed with as much free space as possible so as not to affect the temperature of the conductor.

Figure 5:
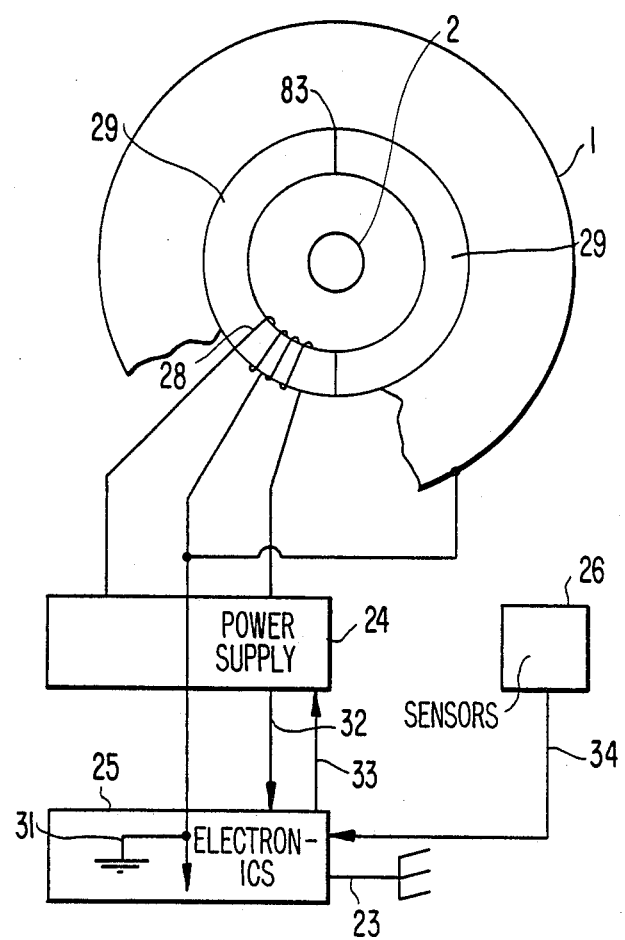
FIG. 5 is a general block diagram of the power supply system and electronics of a sensor module.

FIG. 5 illustrates the electronics of sensor module 1 in their overall configuration. They comprise a power supply 24, digitizing and transmitting electronics 25, sensors 26, and antenna 23.

Power to operate the sensor module electronics is normally derived from winding 28 on a primary magnetic core 29 which surrounds line conductor 2. This core is split to accommodate the opening of the module when it clamps around the conductor. The power supply 24 supplies regulated +5 and −5 volts to the electronics 25 and +12 volts for the transmitter as indicated at 32. Local ground is indicated at 31. The electronics 25 provide a transmitter control signal on line 33 to control the power supply to the transmitter. The sensors 26 provide analog signals indicated at 34 to the electronics 25. A detailed schematic diagram of power supply 24 is disclosed in copending application Ser. No. 872,011.

Figure 6:
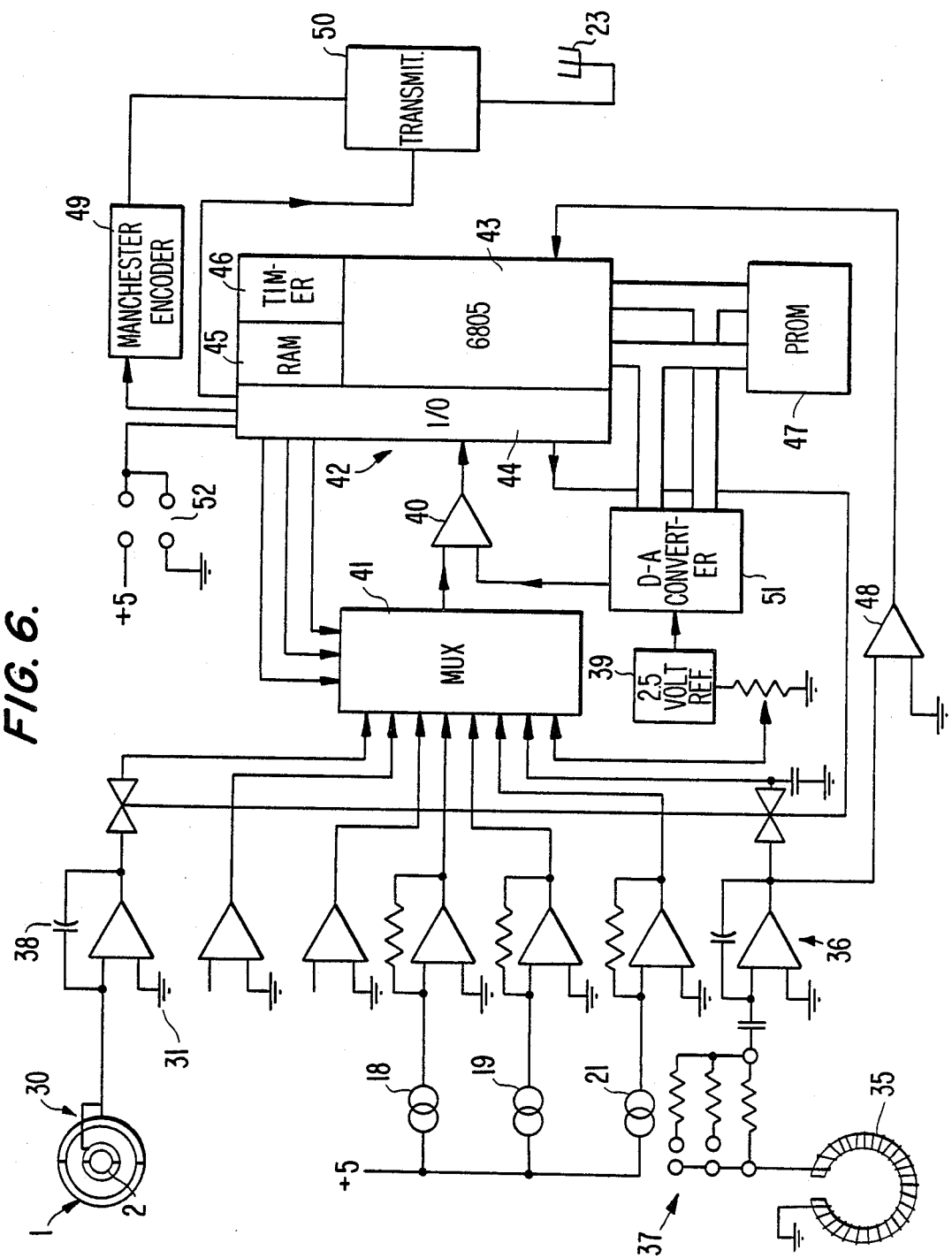
FIG. 6 is a block diagram of the electronics of the sensor module.

FIG. 6 is a block diagram of the electronics 25. Conductor current is measured by the Rogowski coil 35 which is connected to one of a plurality of input amplifiers 36 through current range select resistors 37. Voltage sensing apparatus consisting of the housing and insulated hub generally indicated at 30 is connected to the uppermost amplifier which is provided with a capacitor 38 in the feedback circuit which sets gain and provides an amplifier output voltage in phase with line to neutral high tension voltage. It also provides integrator action for the measurement of current the same way as the amplifier connected to the Rogowski coil. Thus amplifier 36 connected to the voltage sensing apparatus 30 is a low impedance current measuring means connected between the power conductor 2 and insulated hub portions 13 and 14 (FIG. 3).

Each of the temperature transducers 18, 19, and 21 is connected to a separate one of the amplifiers 36 as shown. Spare amplifiers are provided for measurement of additional characteristics such as the interior temperature of module 1. Each of the amplifiers 36 is connected for comparison with the output of digital-to-analog converter 51 from 2.5 volts reference source 39 at comparator 40 by the multiplexer 41 under control of the digital computer 42. The digital computer may be a Motorola CMOS 6805 microprocessor 43 having I/O 44, RAM 45 and timer components 46. A programmable read only memory 47 is connected thereto for storing the program. A zero crossing detector 48 detects the zero crossings of the voltage or current in the Rogowski coil 35 and provides basic synchronization. A module ID number is selected by jumpers generally indicated at 52. The digitized data assembled into an appropriate message is encoded in Manchester code by the encoder 49 and supplied to a 950 MHz transmitter 50 which then supplies it to the antenna 23. A detailed schematic diagram of the electronics is disclosed in copending application Ser. No. 484,681.

Figure 7:
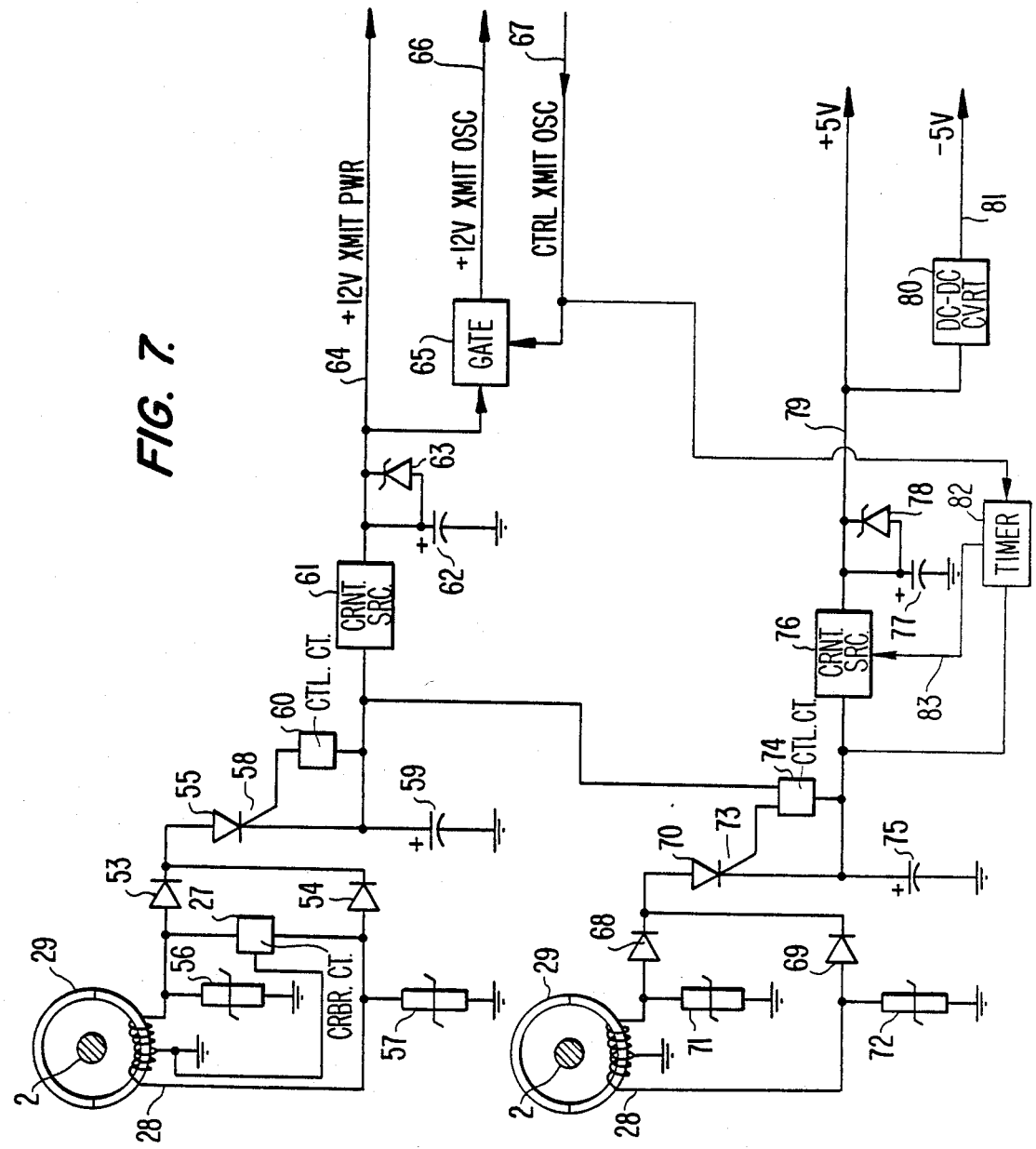
FIG. 7 is a block diagram of the sensor module power supply.

FIG. 7 is a block diagram of the power supply without the shunt regulator circuitry of the present invention. During typical sensor module operation, power is derived through electromagnetic induction using the magnetic field generated as a result of current flowing through conductor 2. The hinged core transformer with the line conductor forming the single turn primary supplies all internal power to the sensor module. Current in conductor 2 induces voltage and current in winding 28 on magnetic core 29.

In the transmitter power supply section (upper half of FIG. 7), current in winding 28 is rectified by diodes 53 and 54 producing a full wave rectified wave form at the anode of silicon controlled rectifier (SCR) 55. Protection against power surges is provided by MOV devices 56 and 57 and crowbar circuit 27. SCR 55, with its gate 58 controlled by control circuit 60, produces approximately +13 volts raw DC at capacitor 59. Gate 60 senses the DC output voltage and if this voltage exceeds a predetermined value SCR 55 is turned off. This effectively removes the load from winding 28 and places an open circuit across it. However, as previously mentioned, when the conductor current is very high, large secondary voltage peaks appear across the unloaded winding as the conductor current passes through zero. This can result in damage to the protection circuitry, the diodes and the SCR. The raw DC produced at capacitor 59 is delivered to a constant current source 61 which, with zener diode 63, regulates the raw DC to produce a constant voltage of +12 volts DC across capacitor 62. The 12 volts DC is supplied on line 64 to power the transmitter. The +12 volts DC is also supplied to the transmitter oscillator on line 66 through gate 65. Gate 65 is controlled by the CTRL XMIT OSC signal on line 67 which is generated by the sensor module's processor. The processor generates this signal during normal operation to initiate transmissions to the groundstation. This transmit control signal is typically generated once per second for a period of 16 ms to power the transmitter oscillator.

The logic section of the power supply (lower half of FIG. 7), similar to the transmitter section, includes diodes 68 and 69. These diodes rectify the current in winding 28 to produce a full wave rectified wave form at the anode of SCR 70. MOV devices 71 and 72 provide power surge protection. SCR 70, with its gate 73 controlled by control circuit 74, produces approximately +6.5 volts raw DC at capacitor 75. Similar to the operation of gate 60 described above, gate 74 operates to remove the load from the transformer winding 28 when the load voltage reaches a predetermined level. Again, damage to the circuitry can result from large voltage peaks appearing across the unloaded winding. The raw DC produced at capacitor 75 is delivered to constant current source 76 which, with zener diode 78, regulates the raw DC to produce a constant voltage of +5 volts across capacitor 77. This regulated +5 volts is delivered to the module's digital logic circuits and to DC-DC converter 80 on line 79. The DC-DC converter 80 converts the +5 volts to −5 volts which is delivered to the module's analog circuits on line 81.

Figure 8A:
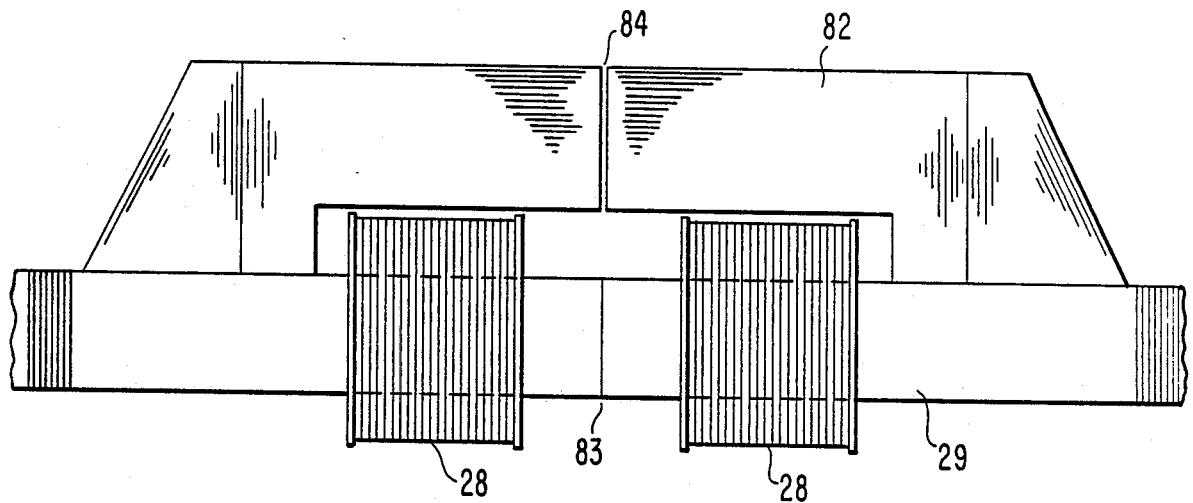
FIG. 8a is a diagram of a first embodiment of the primary magnetic core and shunt magnetic core of the present invention.
Figure 8B:
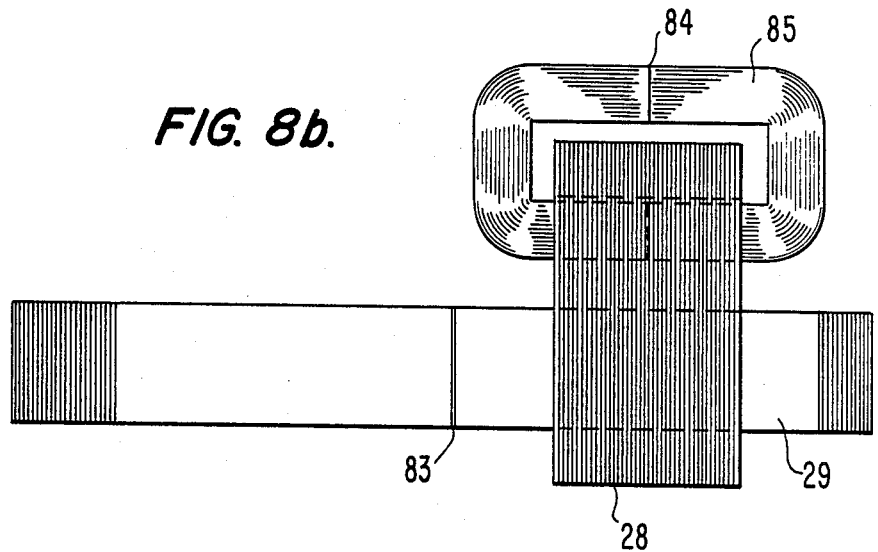
FIG. 8b is a diagram of a second embodiment of the primary magnetic core and shunt magnetic core of the present invention.

FIGS. 8a and 8b illustrate two embodiments of the present invention in which the magnetic circuit of the power supply has been modified to overcome the disadvantages of the circuitry shown in FIG. 7.

FIG. 8a illustrates one embodiment of the present invention in which a secondary core 82 has been added in shunt to primary core 29. As best illustrated in FIG. 5, the primary core 29 consists of two halves separated by gap 83 which is necessary to allow the hinged sensor module 1 to be opened and closed around conductor 2. The gap 83 is made as small as possible and core 28 cross-section made as large as possible to reduce the reluctance of the magnetic circuit. Primary core 29 has a relatively high inductance at low levels of current flowing through conductor 2. This is an important feature that enables sensor module 1 to operate and monitor line conditions even with minimum current in the line.

Referring to FIG. 8a, the secondary shunt core 82 includes a relatively large air gap 84 which is chosen to provide a high reluctance relative to the primary core 29. As a result, the shunt magnetic path does not impair voltage inductance in the winding secondary when current in the conductor is low. The size of the air gap 84 chosen for shunt core 82 determines at what value of current in the conductor flux will be diverted to the secondary core. As the primary core begins to saturate due to a high current condition, flux is diverted to the secondary core. This prevents a sudden change in flux from linking the winding and thereby limits the current in the winding.

FIG. 8b illustrates a second embodiment of the present invention in which the shunt magnetic path is provided by a separate cut core 85 coupled to winding 28. This second embodiment functions similarly to the first embodiment but has an advantage in that close coupling between the shunt core and primary core is no longer necessary. A disadvantage is slightly larger dissipation due to the increased length of copper winding 28. Further, rather than preventing the portion of the primary core linking the winding from becoming saturated, the flux generated in the secondary core is opposed to the flux in the primary core. The net flux linking the winding is therefore limited as is the current induced in the winding.

In both embodiments of the present invention, the secondary shunt core includes a larger air gap and therefore has higher reluctance than the primary core. However, the total reluctance of the magnetic circuit in a circular path around the winding (including a portion of the primary core and the secondary core) is low enough to permit sufficient induced voltages even with minimum currents. The physical dimensions of the cores and air gaps will of course vary with each application of the present invention and will depend on the particular operating parameters of the sensor module.

Figure 9:
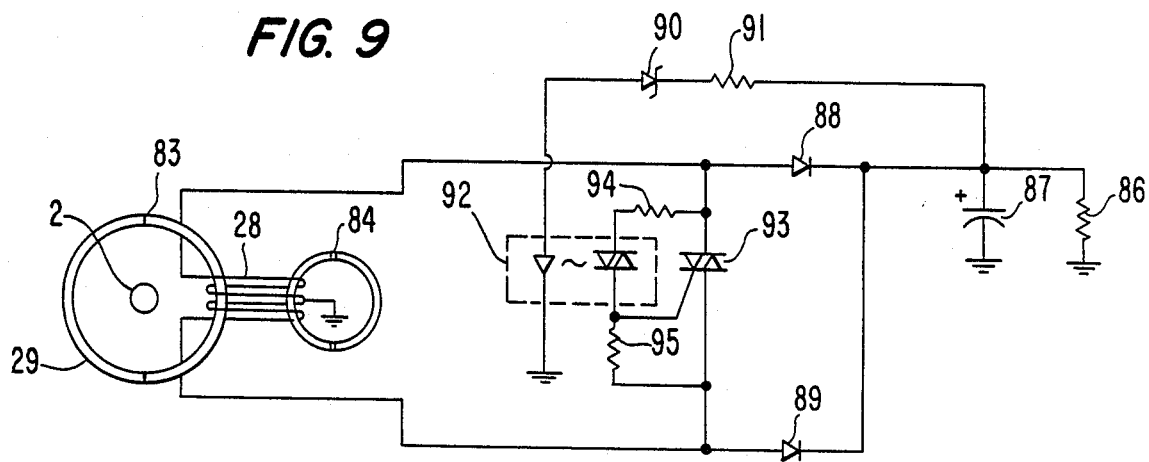
FIG. 9 is a schematic diagram of the modified power supply circuitry of the present invention.

FIG. 9 illustrates a portion of the power supply electronics as modified in accordance with the present invention. FIG. 9 shows the electronics configured with the embodiment of FIG. 8b but is equally applicable to the embodiment of FIG. 8a. The circuitry of FIG. 9 is shown only as a functional representation as it relates to the circuitry of FIG. 7. For example, the load on the power supply is represented as resistance 86 with the load voltage measured at capacitor 87.

As described above with reference to FIG. 7, rough regulation was previously provided by removing the load when the load voltage exceeded a predetermined value. This was accomplished by placing a SCR in a very high impedance (off) state. However, under high conductor current conditions large voltages appear across the unloaded winding.

The circuitry of FIG. 9 in conjunction with the magnetic circuit of FIGS. 8a or 8b overcomes this disadvantage. contrast to the power supply circuitry of FIG. 7, the circuitry of the present invention removes the load from the secondary winding 28 by placing a direct short circuit across the winding when a predetermined load voltage is reached. In FIG. 9, the load is represented as resistor 86. Diodes 88 and 89 rectify the current in winding 28 to produce a DC output voltage as measured at capacitor 87. As the output voltage increases beyond a predetermined value (zener voltage of zener diode 90), reverse current begins to increase through zener diode 90 and limiting resistor 91. This reverse current flows through optically coupled triac 92 which turns on to provide gate current to triac 93. Triac 93, connected in parallel with resistors 94 and 95, turns on to provide an effective short circuit (very low impedance circuit path) across winding 28 when the load voltage exceeds a set value.

As a result of the circuit configuration of the present invention, excess currents in the transformer secondary induced from excess currents in conductor 2 are bypassed to limit the DC output voltage. However, without the shunt magnetic core, this would result in excessive dissipation in transformer winding 28 due to the high inductance of the transformer primary core 29. In one embodiment, the reluctance caused by air gap 84 in the shunt magnetic core acts to limit the rapid saturation of that part of the primary core which links the winding. In a second embodiment the opposing flux in the secondary core acts to limit the net flux linking the winding. In both embodiments the current induced in winding 28, and associated dissipation, are limited to an acceptable value.

From the foregoing description, it can be seen how the present invention provides a unique solution to the problem of operating a power supply in an environment where the power source may fluctuate over a wide range of current values. While the preferred embodiment is disclosed as part of a transmission line sensor module, the present invention is applicable to other power supplies with varying values of source current.

The novel apparatus of the present invention protects the module's processor and transmitter circuitry from high output voltages without subjecting the protection and conversion circuitry to possible damage.

In addition, the present invention protects the load circuitry without requiring high voltage rectifiers. This feature permits the sensor module to operate under the condition of low conductor current.

The air gap in the shunt magnetic core adds the required reluctance to the magnetic circuit to prevent rapid saturation of the primary core at high flux densities. This limits induction of high currents in the secondary winding when excess current is flowing in the conductor. At low flux densities, the high inductance of the primary core permits sufficient voltage output with low conductor current.

Thus the present invention allows the transmission line sensor module to operate under a wide range of line conditions that are typically encountered in the power transmission environment.

From the foregoing detailed description, it will be evident that there are a number of changes, adaptations and modifications of the present invention which come within the province of those persons having ordinary skill in the art to which the invention pertains. However, it is intended that all such variations not departing from the spirit of the invention be considered as within the scope thereof as limited solely by the appended claims.

I claim:

1. A device for monitoring at least one parameter of a high voltage power transmission line conductor for carrying alternating current, said device including means for removably attaching said device to said conductor, a coil for measuring current in said conductor and a power supply separate from said current measuring coil, said power supply comprising:

a first saturable magnetic core linked to said line conductor and having induced therein alternating magnetic flux generated by said alternating current;

said first magnetic core being arranged in said device to surround said line conductor when said device is mounted on said conductor, said first magnetic core including a first air gap that is small in relation to the cross section of said first magnetic core to provide a relatively high inductance at low level of current in said conductor;

a winding on a portion of said first magnetic core, said portion linking said winding to said conductor whereby alternating current is induced in said winding by said alternating magnetic flux; and means for limiting current induced in said winding including means for providing a shunt magnetic path for said first magnetic core;

said means for providing a shunt magnetic path comprising a second magnetic core physically connected to said first magnetic core, said second magnetic core including a second air gap that is large relative to said first air gap to provide a relatively high reluctance at high levels of current in said conductor.

2. A device as defined in claim 1 further including:

means coupled to said winding for converting alternating current into direct current;

means coupled to said means for converting for supplying power to low power load circuitry in said device;

means for limiting load voltage of said low power load circuitry;

means responsive to said means for limiting for disabling said means for supplying power to said load circuitry when a predetermined load voltage level is reached; and said means for disabling including means for placing a very low impedance circuit path across said winding.

3. A device as defined in claim 2 wherein said means for limiting load voltage includes a zener diode.

4. A device as defined in claim 2 wherein said means for placing a very low impedance circuit path across said winding includes a triac.

5. A device for monitoring at least one parameter of a high voltage power transmission line conductor for carrying alternating current, said device including means for removably attaching said device to said conductor, a coil for measuring current in said conductor and a power supply separate from said current measuring coil, said power supply comprising:

a first saturable magnetic core linked to said line conductor and having induced therein alternating magnetic flux generated by said alternating current;

said first magnetic core being arranged in said device to surround said line conductor when said device is mounted on said conductor, said first magnetic core including a first air gap that is small in relation to the cross section of said first magnetic core to provide a relatively high inductance at low levels of current in said conductor;

a winding on a portion of said first magnetic core, said portion linking said winding to said conductor whereby alternating current is induced in said winding by said alternating magnetic flux; and means for limiting current induced in said winding including means for providing a shunt magnetic path for said first magnetic core;

said means for providing a shunt magnetic path comprising a second magnetic core linked to said first magnetic core by said winding, said second magnetic core including a second air gap that is large relative to said first air gap to provide a relatively high reluctance at high levels of current in said conductor.

* * * * *